United States Patent [19]
Campardo et al.

[11] Patent Number: 6,128,225
[45] Date of Patent: *Oct. 3, 2000

[54] METHOD AND CIRCUIT FOR READING LOW-SUPPLY-VOLTAGE NONVOLATILE MEMORY CELLS

[75] Inventors: Giovanni Campardo, Bergamo; Rino Micheloni, Turate; Stefano Commodaro, Bogliasco, all of Italy

[73] Assignee: STMicroelectronics S.r.l., Agrate Brianza, Italy

[ * ] Notice: This patent issued on a continued prosecution application filed under 37 CFR 1.53(d), and is subject to the twenty year patent term provisions of 35 U.S.C. 154(a)(2).

[21] Appl. No.: 08/879,017

[22] Filed: Jun. 18, 1997

[30] Foreign Application Priority Data

Jun. 18, 1996 [EP] European Pat. Off. .............. 96830344

[51] Int. Cl.[7] .................................................. G11C 16/02
[52] U.S. Cl. .................................... 365/185.2; 365/185.21
[58] Field of Search ........................... 365/185.2, 185.21, 365/189.07, 195.01, 189.01

[56] References Cited

U.S. PATENT DOCUMENTS

| | | | |
|---|---|---|---|
| 4,725,984 | 2/1988 | Ip et al. | 365/185.21 |
| 5,301,149 | 4/1994 | Jinbo | 365/185.21 |
| 5,396,467 | 3/1995 | Liu et al. | 365/210 |
| 5,422,854 | 6/1995 | Hirano et al. | 365/210 |
| 5,487,045 | 1/1996 | Trodden | 365/205 |
| 5,627,790 | 5/1997 | Golla et al. | 365/210 |
| 5,717,640 | 2/1998 | Hashimoto | 365/189.07 |

OTHER PUBLICATIONS

Ashmore et al., "A 20ns 1Mb CMOS BurstMode EPROM," in *1989 IEEE International Solid–State Circuits Conference*, Digest of Technical Papers, New York, New York., pp. 40–41.

*Primary Examiner*—David Nelms
*Assistant Examiner*—Hoai V. Ho
*Attorney, Agent, or Firm*—Theodore E. Galanthay; E. Russell Tarleton; Seed IP Law Group, PLLC

[57] ABSTRACT

The read circuit has an array branch connected to an array cell, and a reference branch connected to a reference cell; the array branch presents an array load transistor interposed between a supply line and the array cell, and the reference branch presents a reference load transistor interposed between the supply line and the reference cell; and the array and reference load transistors form a current mirror wherein the array load transistor is diode-connected and presents a first predetermined channel width/length ratio, and the reference load transistor presents a second predetermined channel width/length ratio N times greater than the first ratio, so that the current flowing in the array cell is supplied, amplified, to the reference branch.

22 Claims, 3 Drawing Sheets

METHOD AND CIRCUIT FOR READING LOW-SUPPLY-VOLTAGE NONVOLATILE MEMORY CELLS

TECHNICAL FIELD

The present invention relates to a method and circuit for reading low-supply-voltage nonvolatile memory cells.

BACKGROUND OF THE INVENTION

As is known, the most commonly used method of reading memory cells is to compare a quantity related to the current flowing through the memory cell to be read with a similar quantity related to the current flowing through a reference cell of known content, and using a circuit arrangement of the type shown in FIG. 1.

Number 1 in FIG. 1 indicates a circuit for reading the cells of a memory array, comprising an array branch 2 connected by an array bit line 5 to an array cell 4 to be read; and a reference branch 3 connected by a reference bit line 9 to a reference cell 8 of known content.

Array branch 2 comprises a current-voltage converter 6—hereinafter referred to as an array converter—connected on one side to array bit line 5 by a decoding circuit (not shown), and on the other side to a supply line 7 at voltage $V_{cc}$.

Reference branch 3 comprises a current/voltage converter 10—hereinafter referred to as a reference converter—connected on one side to reference bit line 9 by a decoding circuit (not shown), and on the other side to supply line 7.

Each current/voltage converter 6 and 10, respectively, comprises a precharge and biasing circuit 11 and 12 (for appropriately biasing the respective bit lines 5 and 9 to prevent spurious write phenomena, such as soft-writing, and possibly also for equalizing lines 5 and 9) and a respective load 13 and 14 connected in series with each other. The nodes 15 and 16 between respective precharge and biasing circuits 11 and 12 and respective loads 13 and 14 form the outputs of respective current/voltage converters 6 and 10 and are connected to the input of a sense amplifier 17 for comparing the voltages of nodes 15 and 16 to determine the content of array cell 4.

Load 13 comprises a P-channel MOS transistor with a predetermined channel width to length ratio $W_1/L_1$. Load 14 comprises a diode-connected P-channel MOS transistor with a channel width to length ratio $W_2/L_2$ that is N times greater than ratio $W_1/L_1$, and MOS transistors 13 and 14 present the control terminals connected to each other, the source terminals connected to supply line 7, and the drain terminals connected respectively to nodes 15 and 16 to form a current mirror in which the current flowing in transistor 13 is N times less than that flowing in transistor 14.

Array bit line 5 is connected to a number of array cells 4 located in the same array column, and the capacitances of which are shown schematically in FIG. 1 by an equivalent array capacitor 18, which, for the sake of simplicity, is shown connected directly to node 15. Similarly, reference bit line 9 is connected to a number of reference cells located in the same reference column, and the capacitances of which are shown schematically in FIG. 1 by an equivalent reference capacitor 19 connected to node 16.

To safely determine the content of array cell 4, i.e., whether the cell is erased or written, reference cell 8, when biased at a given read voltage, generates a reference current $I_R$, the value of which is mirrored in array branch 6 and is between the value of the current generated by an erased array cell 4 and the value of the current generated by a written array cell 4. In the FIG. 1 circuit, therefore, sense amplifier 17 compares the value of the voltage $V_R$ present at reference node 16 and related to current $I_R$ generated by reference cell 8, with the value of the voltage $V_M$ present at array node 15 and related to the difference between the current $I_M$ generated by array cell 4 and the current $I_O$ supplied by load 13 (and in turn equal to the current IR mirrored—multiplied by factor 1/N—in array branch 2).

To give a clearer idea of the concept involved, the FIG. 2 diagram shows the characteristics $I_{DS}=f(V_{GS})$ of array and reference cells 4 and 8. More specifically, A indicates the characteristic of array cell 4 when erased (distributed about that of reference cell 8); B indicates the characteristic of array cell 4 when written, C indicates the characteristic of reference cell 8 as mirrored by mirror circuit 13 and 14 in array branch 2; $V_{th1}$ is the threshold value of the erased array cell 4; and $V_{th2}$ is threshold value of the written array cell 4. As can be seen, in the FIG. 1 circuit solution, the slope of mirrored characteristic C of reference cell 8 is less by a factor N than that of characteristics A and B of erased and written array cells 4, due to the current $I_O$ flowing in transistor 13 being N times less than that imposed by reference cell 8 in transistor 14, and the characteristic of reference cell 8 presents a reference threshold value equal to the threshold value $V_{th1}$ of erased array cell 4.

As shown in FIG. 2, in the FIG. 1 circuit solution, the maximum read voltage of array and reference cells 4 and 8 is substantially equal to the value at which characteristic B of written array cell 4 intersects characteristic C of reference cell 8, and, since the read voltage also represents the supply voltage of read circuit 1, there is therefore a limit to the maximum permissible supply voltage value $V_{cc}$.

To overcome the problem, according to a (not shown) solution described in EP-A-O 676 768 published on Nov. 10, 1995, the characteristic of reference cell 8 is approximated, not by a single straight line, but by a broken line comprising two segments: a first segment presenting the same slope as curve C in FIG. 2 and comprised between the threshold voltage of an erased cell and a predetermined intermediate voltage; and a second segment presenting the same slope as curves A and B. By being divided into two segments, the characteristic of reference cell 8 (shown by the dotted-line curve D in FIG. 2) lies between characteristics A and B and no longer intersects characteristic B of written array cell 4, even in the event of a high read, and hence supply, voltage.

In the known solutions described, the ratio between the current flowing in loads 13 and 14 is essential, as stated, for distinguishing the written from the erased cells. In fact, as is known, to reduce the read time of array cells 4 when erased, the current flowing in array cell 4 must be much greater than that flowing in transistor 13 so as to rapidly discharge capacitor 18 and hence rapidly reduce the voltage at node 15. Whereas, to reduce the read time of array cells 4 when written, the current generated by reference cell 8 must be high, so that the corresponding mirrored current $I_O$ in transistor 13 rapidly charges capacitor 18 and so brings the voltage at node 15 rapidly to a value close to that of supply voltage Vcc.

The present tendency, however, is to reduce supply voltage as far as possible to permit wider use of read circuits 1, even in portable equipment and low-supply applications. Reducing the supply voltage, however, results in a considerable reduction in the currents $I_R$, $I_M$ generated by array and reference cells 4, 8 and hence an increase in the read time of circuit 1.

SUMMARY OF THE INVENTION

It is an object of the present invention to provide a read method and circuit permitting read times compatible with demand, even in the event of low supply voltage.

According to the present invention, there are provided a method and circuit for reading low-supply-voltage nonvolatile memory cells. In one embodiment of the invention, a circuit is provided for reading data stored in a nonvolatile memory cell that has control and output terminals and that has a threshold that is programmed at either a first or second voltage. When programmed at the first voltage, the memory cell stores a first data value; and when programmed at the second voltage, the memory cell stores a second data value, where the second voltage is greater than the first voltage. The circuit includes a read terminal that is coupled to the control terminal of the memory cell and that is also coupled to receive a read voltage. An amplifier has a first input terminal coupled to the output terminal of the memory cell, a second input terminal, and an output terminal that provides the stored data value. A reference cell has a control terminal that is coupled to the read terminal and has an output terminal that is coupled to the second input terminal of the amplifier. The reference cell has a reference threshold that is less than the read voltage. A current mirror has a current input terminal that is coupled to the output terminal of the memory cell and has a current output terminal that is coupled to the output terminal of the reference cell.

DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 3:
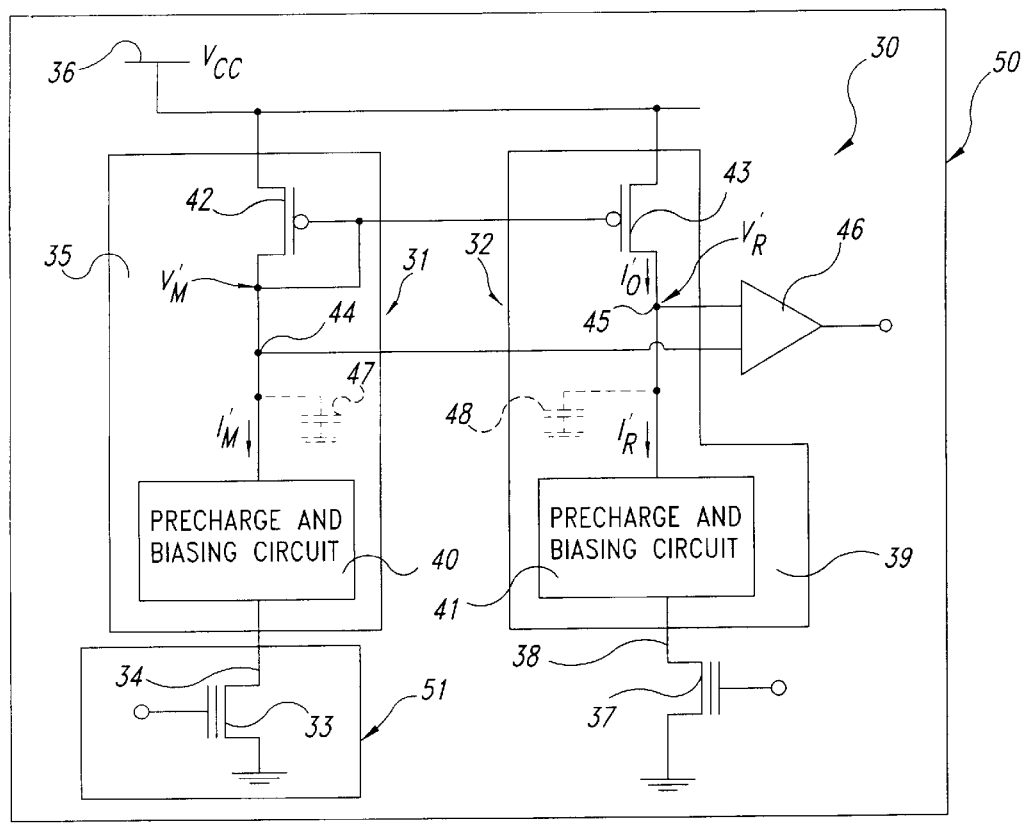
FIG. 3 shows the circuit diagram of a read circuit in accordance with the present invention.

Number 50 in FIG. 3 indicates a nonvolatile memory, e.g., a flash-EEPROM memory, comprising a memory array 51 including a plurality of array cells 33 connected to a read circuit 30 in accordance with the present invention.

Figure 1:
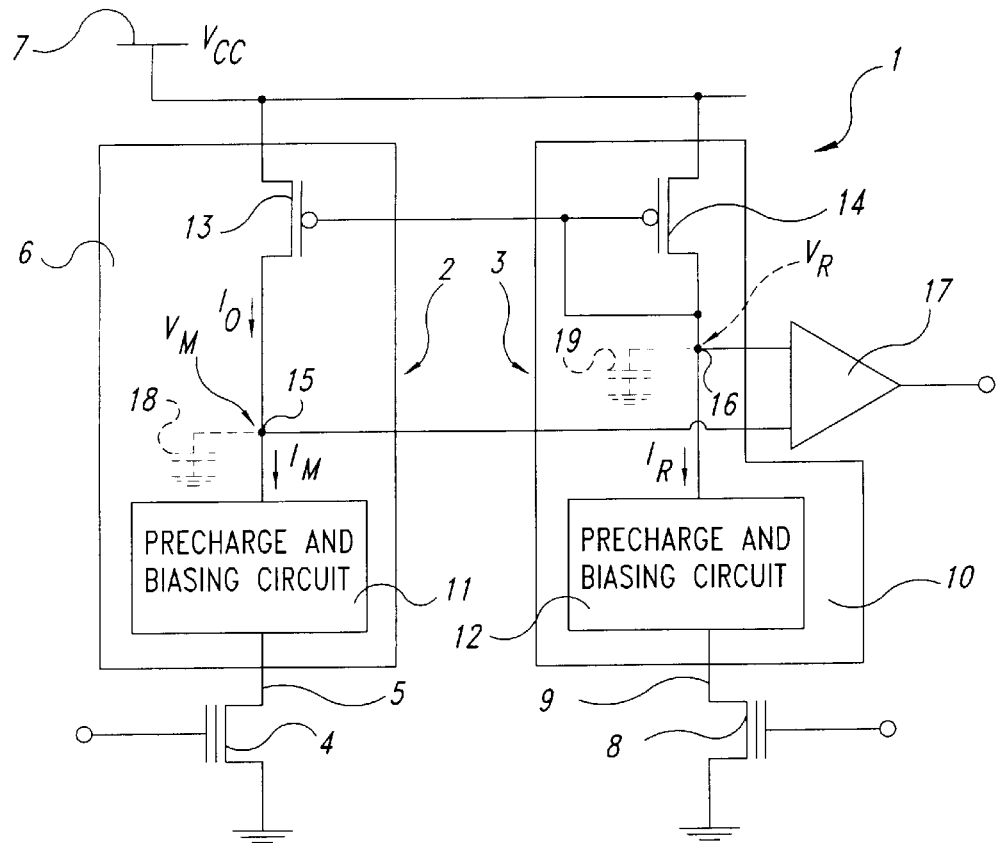
FIG. 1 shows the circuit diagram of a known read circuit.

Like circuit 1 in FIG. 1, read circuit 30 comprises an array branch 31 connected to an array cell 33 by an array bit line 34, and a reference branch 32 connected to a reference cell 37 by a reference bit line 38.

Array branch 31 comprises an array converter 35 connected on one side to array bit line 34 and on the other to a supply line 36 at voltage $V_{cc}$, and reference branch 32 comprises a reference converter 39 connected on one side to reference bit line 38 and on the other to supply line 36.

Like circuit 1 in FIG. 1, each converter 35 and 39, respectively, comprises a conventional precharge and biasing circuit 40 and 41 and a load 42 and 43 connected in series with each other. The nodes 44 and 45 between respective precharge and biasing circuits 40 and 41 and respective loads 42 and 43 are connected to the inputs of a sense amplifier 46.

Unlike known read circuit 1, load 42 comprises a diode-connected P-channel MOS transistor with a predetermined ratio $W_1/L_1$, and load 43 comprises a P-channel MOS transistor with a ratio $W_2/L_2$ N times greater than ratio $W_1/L_1$. MOS transistors 42 and 43 are connected to form a current mirror, so that the current $I'_O$ flowing in transistor 43 is driven towards being N times greater than the current $I'_M$ flowing in transistor 42.

Like circuit 1 in FIG. 1, each node 44 and 45 is connected to an equivalent capacitor 47 and 48 representing the capacitances of the cells connected to nodes 44 and 45.

Read circuit 30 operates in the same way as circuit 1, except that, in this case, sense amplifier 46 compares the value of the voltage $V'_M$ present at node 44 which is related to the current $I'_M$ generated by array cell 33, with the value of the voltage $V'_R$ present at node 45, which is related to the difference between the current $I'_R$ generated by reference cell 37 and the current $I'_O$ supplied by load 43. The current $I'_O$ is equal to the current $I'_M$ mirrored and multiplied by factor N in reference branch 32. Unlike read circuit 1 in FIG. 1, therefore, it is current $I'_M$ generated by array cell 33 that is mirrored, instead of current $I'_R$ generated by reference cell 37. In one embodiment of the invention, N is between 2 and 10.

Another way of viewing the operation of the circuit of FIG. 3 is as follows. When the cell 33 is erased, the voltage $V'_M$ is lower than the voltage $V'_R$, and thus the comparator 46 recognizes this state as the cell 33 being erased. Conversely, when the cell 33 is written, the voltage $V'_M$ is greater than the voltage $V'_R$, and the comparator 46 recognizes this as the cell 33 being written. More specifically, when the cell 33 is erased and a read voltage is applied to its gate, the cell 33 draws the current $I'_M$ from the node 44. Because the inputs to the comparator 46 are high impedance, little or no current flows from the node 44 into the comparator 46. Therefore, according to Kirchoff's current law, the load device 42 provides the current $I'_M$ to the node 44 so that the net flow of current into the node 44 is zero. Due to the multiplying action of the current mirror formed by the transistors 42 and 43, the transistor 43 attempts to generate $I'_O$ equal to $N \times I'_M$. But again due to Kirchoff's current law, the reference current $I'_R$ is flowing out of the node 45. Therefore, in a steady state condition, the maximum value of $I'_O$ equals $I'_R$. But because the current mirror is trying to drive $I'_O$ to a greater value, the transistor 43 heads towards its saturation region thus raising the voltage $V'_R$ at the node 45 to a value that is higher than $V'_M$. Conversely, when the cell 33 is written, $I'_M$ equals zero. Therefore, the current mirror action biases the transistor 43 to generate $I'_G$ equal to zero as well. The reference cell 37, however, attempts to draw $I'_R$ from the node 45. But because of Kirchoff's current law, $I'_R$ must equal $I'_O$ equal zero. Therefore, the cell 37 heads toward saturation region thus dropping the voltage $V'_R$ to near zero and thus well below the voltage $V'_M$. During both reading of a written cell 33 and/or erase cell 33, the voltage $V'_M$ is approximately half-way between $V_{CC}$ and ground.

Moreover, using a single reference cell 37 outside memory array 51, its threshold voltage may be adjusted to a low value in the course of EWS (Electrical Wafer Sort) testing, so that reference cell 37 conducts a high current even in the presence of a low supply voltage $V_{cc}$. On the other hand, a similar reduction in the threshold voltage of array cell 33 is not possible, as this would increase the number of depleted cells in memory array 51. The solution according to the present invention, however, effectively provides for a high read current of array cells 33, and hence for reducing read time, by multiplying by N the current flowing in cells 33 and providing this larger current as the current $I'_O$ in the branch 32.

Figure 2:
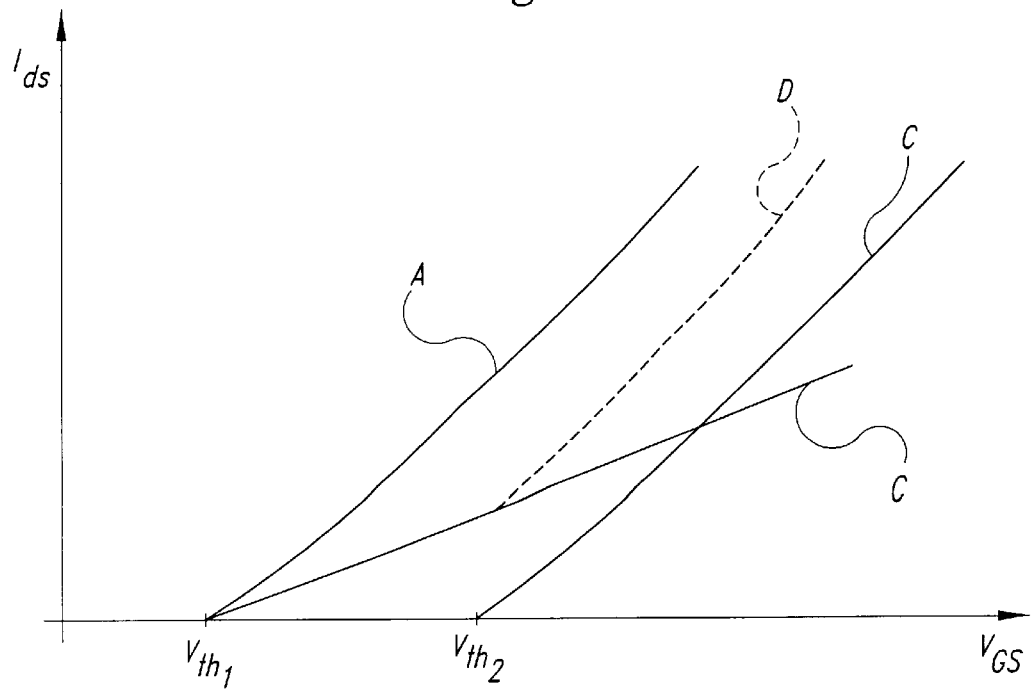
FIG. 2 shows the characteristics for evaluating the memory cells according to the FIG. 1 solution.
Figure 4:
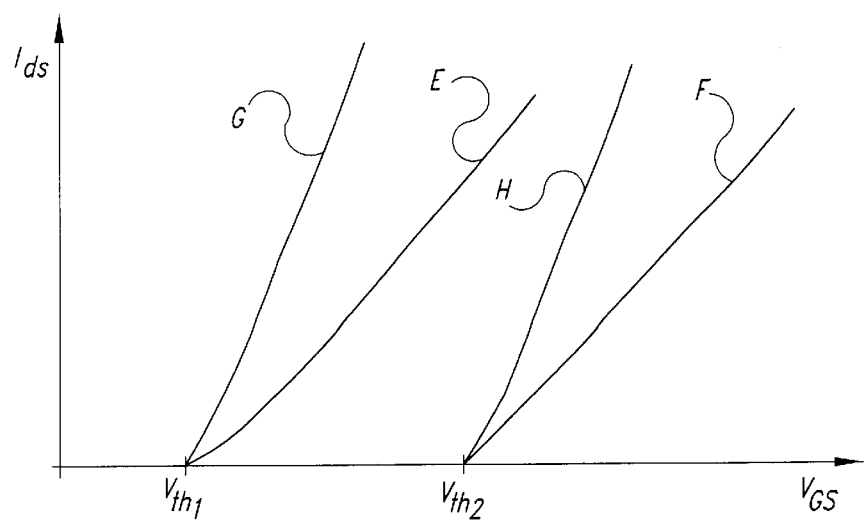
FIG. 4 shows the characteristics obtainable using the FIG. 3 circuit.

Circuit 30 therefore provides for achieving the characteristics shown in FIG. 4, in which E indicates the characteristic of array cell 33 when erased (coinciding with that of reference cell 37), F indicates the characteristic of array cell 33 when written, and G and H, respectively, indicate the erased and written characteristics of array cell 33 mirrored in reference branch 32. In FIG. 4, $V_{th1}$ and $V_{th2}$ have the same meaning as in FIG. 2.

As can be seen, in this case, the slope of characteristics G and H of mirrored current $I'_O$ is greater by a factor N than the slope of characteristic E of reference current $I'_R$ with which current $I'_O$ is compared, so that the comparison is made between currents meeting both the switching requirements of circuit 30 when reading erased and written array cells 33, and the requirements governing the maximum read voltage that may be applied.

In fact, when reading an erased array cell 33, on the one hand, cell 33 draws a current $I'_M$ supplied entirely by load 42, i.e., without discharging capacitor 47 connected to node 44. On the other hand, the current flowing in load 42, when amplified by mirror circuit 42 and 43 in reference branch 32, rapidly charges capacitor 48 connected to node 45, by virtue of being much greater than the current $I'_R$ required by reference cell 37, thus rapidly pulling up the voltage at node 45. Similarly, when reading a written array cell 33, the cell 33 does not draw current at the read voltage considered (that is, at a read voltage between $V_{th1}$ and $V_{th2}$), so that, current $I'_O$ being substantially zero, the current $I'_R$ drawn by reference cell 37 rapidly discharges capacitor 48 connected to node 45, thus rapidly lowering the voltage $V'_R$ at node 45.

Figure 5:
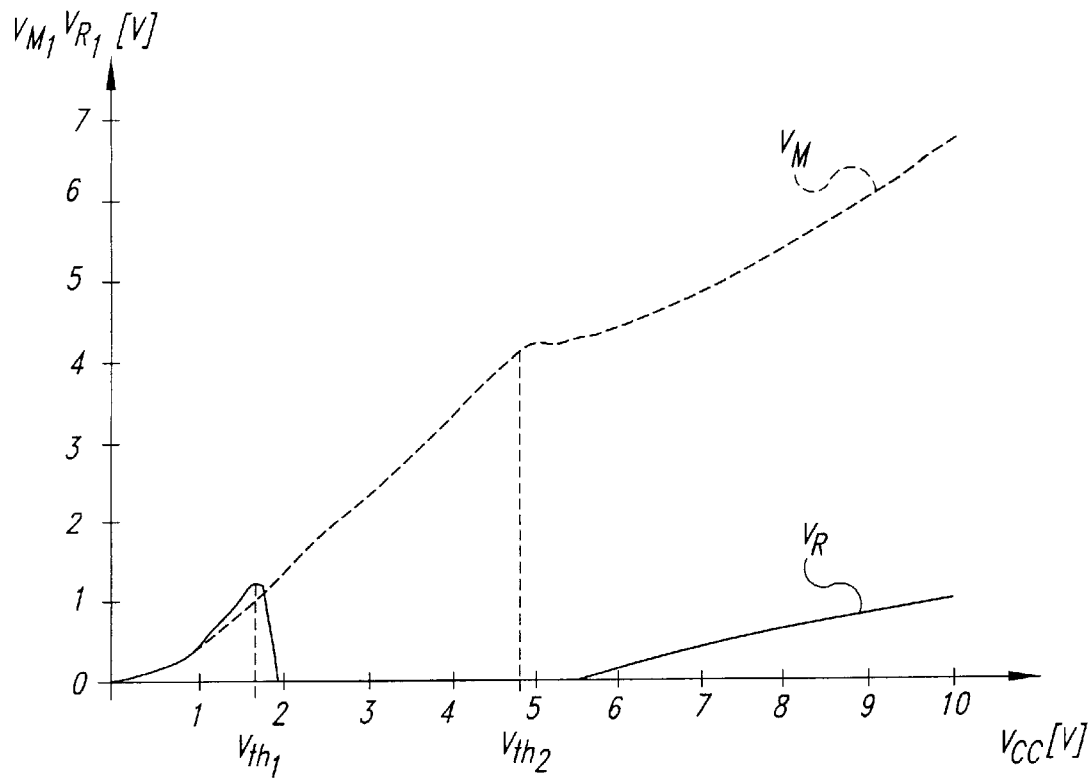
FIGS. 5 and 6 show plots of the output voltages of the FIG. 3 read circuit.
Figure 6:
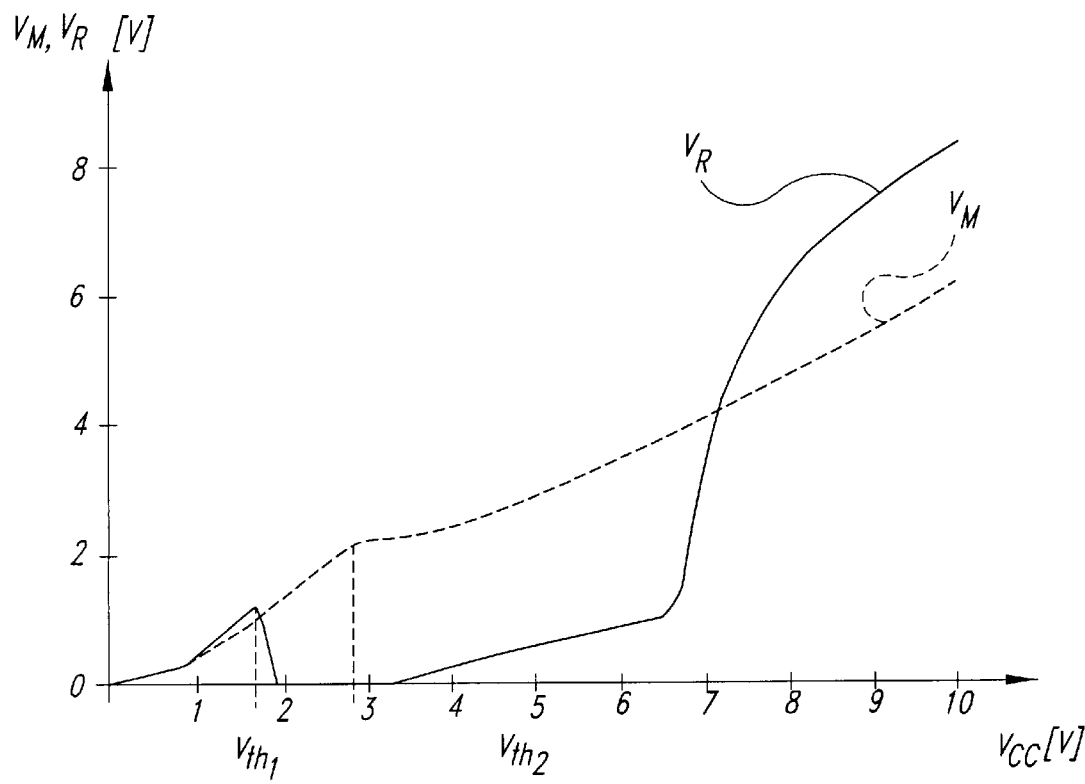

FIGS. 5 and 6 show plots of voltages $V'_M$ and $V'_R$ at respective output nodes 44 and 45 of array and reference converters 35 and 39 as a function of supply voltage $V_{cc}$ (equal to read voltage $V_{gs}$ applied to the control terminals of array and reference cells 33 and 37) and with a difference of 3 V (FIG. 5) and 1 V (FIG. 6) between the threshold voltage $V_{th1}$ of an erased array cell 33 and the threshold voltage $V_{th2}$ of a written array cell 33.

As shown in FIG. 5, N=8; and for supply voltages $V_{cc}$, and hence read voltages $V_{gs}$, below the erased threshold voltage $V_{th1}$ of array cell 33, voltages $V'_M$ and $V'_R$ are equal and roughly follow supply voltage $V_{cc}$, in that no current is drawn by either of cells 33 and 37. Where cell 37 has a threshold of approximately $V_{th1}$ and an $I_{DS}/V_{gs}$ slope that is similar to that of cell 33, and for supply voltages between $V_{th1}$ and $V_{th2}$, only reference cell 37 draws current, so that voltage $V'_R$ at node 45 falls rapidly and remains close to zero, while voltage $V'_M$ at node 44 continues to substantially follow supply voltage $V_{cc}$ (array cell 33 is still turned off because it is written, not erased). Finally, upon the supply voltage exceeding the written threshold $V_{th2}$, array cell 33 also starts conducting and drawing current, and voltage $V'_R$ at node 45 also follows supply voltage $V_{cc}$.

In FIG. 6, N=8, the threshold of cell 37 is approximately Vth1, the $I_{DS}/V_{gs}$ slope is approximately the same as that of the cell 33, and the cell 33 is written, not erased. The behavior of cells 33 and 37 as a function of supply voltage $V_{cc}$ is similar to that shown in FIG. 5, and the FIG. 6 plot also shows output voltages $V'_M$ and $V'_R$ for supply voltages $V_{CC}$ well above the erased and written thresholds $V_{th1}$ and $V_{th2}$. More specifically, in this embodiment of the circuit 50 when supply voltage $V_{cc}$ reaches a predetermined value (about 7 V in the example shown), voltage $V'_R$ at node 45 exceeds voltage $V'_M$ at node 44, so that this value of $V_{cc}$ represents the maximum read voltage permissible for read circuit 30 to function properly.

Of course, the respective plots of $V_M$ and $V_R$ depend on N, $V_{th1}$ and $V_{th2}$, the threshold of the cell 37, and the $I_{DS}/V_{gs}$ slope of the cells 33 and 37. Thus, the plots of $V_m$ and $V_r$ can be altered in other embodiments of the circuit 50 by altering these characteristics. Typical values for the $I_{DS}/V_{gs}$ slope are 25–40 mA/V (e.g., 30 mA/V), for $V_{th1}$ 0.5–3 V (e.g., 1.25 V), for $V_{th2}$ 2.5–7 V (e.g., 5 V).

The advantages of read circuit 30 according to the present invention include the following. In particular, it provides for reading cells 33 of memory array 51 even in the presence of low supply voltage, and with no increase in read time as compared with high-supply-voltage operation, by amplifying the current $I'_M$ generated by array cell 33, and, what is more, is both simple and reliable.

Finally, the circuit solution adopted involves no increase in the fabrication cost or layout requirements of read circuit 30, by virtue of featuring no additional components and simply shifting a diode connection of a transistor.

Clearly, changes may be made to read circuit 30 as described and illustrated herein without, however, departing from the spirit and scope of the present invention. Furthermore, it will be appreciated that, although specific embodiments of the invention have been described herein for purposes of illustration, various modifications may be made without departing from the spirit and scope of the invention. Accordingly, the invention is not limited except as by the appended claims.

What is claimed is:

1. A circuit for reading data stored in a low-supply-voltage, flash-type, nonvolatile memory cell having control and output terminals and having a memory threshold that is programmed at either a first or second voltage, the first voltage causing the cell to store a first data value and the second voltage causing the cell to store a second data value, the second voltage greater than the first voltage, the circuit comprising:

a read terminal coupled to the control terminal of the memory cell, the read terminal also coupled to receive a read voltage;

an amplifier having a first input terminal coupled to the output terminal of the memory cell, the amplifier also having a second input terminal and having an output terminal that provides the stored value;

a reference cell having a control terminal coupled to the read terminal and an output terminal coupled to the second input terminal of the amplifier, the reference cell having a reference threshold that is less than the read voltage; and a current mirror having a current input terminal coupled to the output terminal of the memory cell and having a current output terminal coupled to the output terminal of the reference cell, the current mirror configured to amplify memory cell output current by a current mirror ratio N.

2. The circuit of claim 1 wherein the amplifier comprises a voltage comparator.

3. The circuit of claim 1 wherein the reference cell has a threshold that is equal to or less than the first voltage.

4. The circuit of claim 1 wherein the read voltage is between the first and second voltages.

5. The circuit of claim 1 wherein the read voltage is greater than the second voltages.

6. The circuit of claim 1 wherein the reference cell comprises a nonvolatile reference cell that has a structure that is similar to that of the memory cell.

7. The circuit of claim 1 wherein the current mirror has a current gain that is greater than one.

8. The circuit of claim 1 wherein the current mirror comprises:
   a supply terminal;
   a first transistor coupled between the supply terminal and the current input terminal, the first transistor having a control terminal coupled to the current input terminal, and
   a second transistor coupled between the supply terminal and the current output terminal, the second transistor having a control terminal coupled to the current input terminal.

9. The circuit of claim 1 wherein the current mirror comprises:
   a supply terminal;
   a first transistor coupled between the supply terminal and the current input terminal, the first transistor having a control terminal coupled to the current input terminal and having a first voltage-to-current gain; and
   a second transistor coupled between the supply terminal and the current output terminal, the second transistor having a control terminal coupled to the current input terminal and having a second voltage-to-current gain that is greater than the first voltage-to-current gain.

10. The circuit of claim 1 wherein the current mirror comprises:
    a supply terminal;
    a first MOS transistor coupled between the supply terminal and the current input terminal, the first transistor having a control terminal coupled to the current input terminal and having a first width-to-length ratio; and
    a second MOS transistor coupled between the supply terminal and the current output terminal, the second transistor having a control terminal coupled to the current input terminal and having a second width-to-length ratio that is greater than the first width-to-length ratio.

11. The circuit of claim 1, further comprising:
    a first precharge and bias circuit coupled between the output terminal of the memory cell and the first input terminal of the amplifier; and
    a second precharge and bias circuit coupled between the output terminal of the reference cell and the second input terminal of the amplifier.

12. A method, comprising:
    driving a low-supply-voltage, flash-type, nonvolatile memory cell that is storing a data value with a read voltage such that the memory cell draws a read current from a read node, the read current equaling a first current value when the memory cell is storing a first data value and equaling a second current value when the memory cell is storing a second data value, the first current value being greater than the second current value;
    driving a reference cell with the read voltage such that the reference cell draws a reference current from a reference node;
    supplying to the reference node a drive current that is proportional to the read current when the drive current is less than the reference current, the drive current having a maximum value substantially equal to the reference current; and
    comparing a read voltage at the read node with a reference voltage at the reference node and amplifying memory cell output current by a ratio N and read the data value stored in the memory cell.

13. The method of claim 12, further comprising:
    programming a threshold of the memory cell to a first threshold value to store the first data value in the memory cell; and
    programming the threshold of the memory cell to a second threshold value to store the second data value in the memory cell, the first threshold value being less than the second threshold value.

14. The method of claim 12 wherein the driving a reference cell comprises driving the reference cell such that the reference current is between the first and second current values.

15. The method of claim 12 wherein the first current value is substantially equal to zero.

16. The method of claim 12 wherein the drive current is greater than the read current when the drive current is less than the reference current.

17. The method of claim 12, further comprising:
    programming a threshold voltage of the memory cell to a first threshold value to store the first data value in the memory cell;
    programming the threshold voltage of the memory cell to a second threshold value to store the second data value in the memory cell, the first threshold value being less than the second threshold value; and
    generating the read voltage to be between the first and second threshold values.

18. A circuit for reading data stored in a nonvolatile, low-supply-voltage, flash-type memory cell having control and output terminals and having a memory threshold that is programmed at either a first or second voltage, the first voltage causing the cell to store a first data value and the second voltage causing the cell to store a second data value, the second voltage greater than the first voltage, the circuit comprising:
    a read terminal coupled to the control terminal of the memory cell, the read terminal also coupled to receive a read voltage;
    an amplifier having a first input terminal coupled to the output terminal of the memory cell, the amplifier also having a second input terminal and having an output terminal that provides the stored value;
    a reference cell having a control terminal coupled to the read terminal and an output terminal coupled to the second input terminal of the amplifier, the reference cell having a reference threshold that is less than the read voltage; and
    a current mirror configured to amplify memory cell output current by a ratio N, the current mirror having a current input terminal coupled to the output terminal of the memory cell and having a current output terminal coupled to the output terminal of the reference cell, the current mirror comprising a supply terminal, a first transistor coupled between the supply terminal and the current input terminal, the first transistor having a control terminal coupled to the current input terminal, and a second transistor coupled between the supply terminal and the current output terminal, the second transistor having a control terminal coupled to the current input terminal.

19. A circuit for reading data stored in a low-supply-voltage, flash-type, nonvolatile memory cell having control and output terminals and having a memory threshold that is programmed at either a first or second voltage, the first voltage causing the cell to store a first data value and the second voltage causing the cell to store a second data value, the second voltage greater than the first voltage, the circuit comprising:

- a read terminal coupled to the control terminal of the memory cell, the read terminal also coupled to receive a read voltage;
- an amplifier having a first input terminal coupled to the output terminal of the memory cell, the amplifier also having a second input terminal and having an output terminal that provides the stored value;
- a reference cell having a control terminal coupled to the read terminal and an output terminal coupled to the second input terminal of the amplifier, the reference cell having a reference threshold that is less than the read voltage;
- a first precharge and biasing circuit coupled between the output terminal of the memory cell and the first input terminal of the amplifier, and a second precharge and biasing circuit coupled between the output terminal of the reference cell and the second terminal of the amplifier; and
- a current mirror having a current input terminal coupled to the output terminal of the memory cell and having a current output terminal coupled to the output terminal of the reference cell, the current mirror comprising a supply terminal, a first transistor coupled between the supply terminal and the current input terminal, the first transistor having a control terminal coupled to the current input terminal and having a first voltage-to-current gain, and a second transistor coupled between the supply terminal and the current output terminal, the second transistor having a control terminal coupled to the current input terminal and having a second voltage-to-current gain that is greater than the first voltage-to-current gain to amplify the memory cell output current.

20. A circuit for reading data stored in a low-supply-voltage, flash-type, nonvolatile memory cell having control and output terminals and having a memory threshold that is programmed at either a first or second voltage, the first voltage causing the cell to store a first data value and the second voltage causing the cell to store a second data value, the second voltage greater than the first voltage, the circuit comprising:

- a read terminal coupled to the control terminal of the memory cell, the read terminal also coupled to receive a read voltage;
- an amplifier having a first input terminal coupled to the output terminal of the memory cell, the amplifier also having a second input terminal and having an output terminal that provides the stored value;
- a reference cell having a control terminal coupled to the read terminal and an output terminal coupled to the second input terminal of the amplifier, the reference cell having a reference threshold that is less than the read voltage;
- a first precharge and biasing circuit coupled between the output terminal of the memory cell and the first input terminal of the amplifier, and a second precharge and biasing circuit coupled between the output terminal of the reference cell and the second terminal of the amplifier; and
- a current mirror having a current input terminal coupled to the output terminal of the memory cell and having a current output terminal coupled to the output terminal of the reference cell, the current mirror comprising a supply terminal, a first MOS transistor coupled between the supply terminal and the current input terminal, the first transistor having a control terminal coupled to the current input terminal and having a first width-to-length ratio, and a second MOS transistor coupled between the supply terminal and the current output terminal, the second transistor having a control terminal coupled to the current input terminal and having a second width-to-length ratio that is greater than the first width-to-length ratio to amplify the memory cell output current.

21. A circuit for reading the cells of a low-supply-voltage, flash-type, nonvolatile memory, the circuit comprising:

- an array branch connected to an array cell and a reference branch connected to a reference cell, the array cell generating an array current;
- means for amplifying the array current, the amplifying means comprising an array load transistor element interposed between a reference potential line and said array cell, the array load transistor element presenting a first predetermined channel width/length ratio, a reference load transistor element interposed between the reference potential line and the reference cell, the reference load transistor element presents a second predetermined channel width/length ratio N times greater than the first ratio, and the array load transistor element and the reference load transistor element forming a current mirror wherein the array load transistor element is diode-connected;
- supply means for supplying the read current signal to the reference branch; and
- comparing means for comparing a quantity related to the read current signal with a quantity related to the current flowing in the reference cell.

22. A circuit for reading the cells of a low-supply-voltage, flash-type, nonvolatile memory, the circuit comprising:

- an array branch connected to an array cell and a reference branch connected to a reference cell, the array cell generating an array current;
- means for amplifying the array current, the amplifying means comprising an array load P-channel MOS transistor element interposed between a reference potential line and said array cell, the array load transistor element presenting a first predetermined channel width/length ratio, a reference load P-channel MOS transistor element interposed between the reference potential line and the reference cell, the reference load transistor element presents a second predetermined channel width/length ratio N times greater than the first ratio, and the array load transistor element and the reference load transistor element forming a current mirror wherein the array load transistor element is diode-connected;
- supply means for supplying the read current signal to the reference branch; and
- comparing means for comparing a quantity related to the read current signal with a quantity related to the current flowing in the reference cell.

* * * * *